(12) United States Patent
Lin

(10) Patent No.: US 10,797,037 B1
(45) Date of Patent: Oct. 6, 2020

(54) INTEGRATED CIRCUIT DEVICE HAVING A PLURALITY OF STACKED DIES

(71) Applicant: Xilinx, Inc., San Jose, CA (US)

(72) Inventor: Qi Lin, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/511,796

(22) Filed: Jul. 15, 2019

(51) Int. Cl.
G11C 5/06 (2006.01)
H01L 25/18 (2006.01)
H01L 25/00 (2006.01)
G11C 7/10 (2006.01)
H01L 23/48 (2006.01)
G11C 8/12 (2006.01)

(52) U.S. Cl.
CPC ............ *H01L 25/18* (2013.01); *G11C 7/1078* (2013.01); *G11C 8/12* (2013.01); *H01L 23/481* (2013.01); *H01L 25/50* (2013.01)

(58) Field of Classification Search
CPC ....... H01L 25/18; H01L 23/481; H01L 25/50; G11C 7/1078; G11C 8/12; G11C 5/06
USPC ............ 365/63, 185.05, 185.06, 185.11, 214
See application file for complete search history.

(56) References Cited

U.S. PATENT DOCUMENTS

| 8,946,884 | B2 | 2/2015 | Kwon | |
|---|---|---|---|---|
| 9,153,292 | B2 | 10/2015 | Wu | |
| 9,853,053 | B2 * | 12/2017 | Lupino | H01L 27/11898 |
| 9,935,733 | B1 | 4/2018 | Lesea | |
| 10,475,815 | B2 * | 11/2019 | Lupino | H01L 45/085 |
| 2018/0122825 | A1 * | 5/2018 | Lupino | G11C 11/1675 |

OTHER PUBLICATIONS

"Optimization of Test Wrapper for TSV based 30 SOCs", Surajit Kumar Roy et al, 2011 International Symposium on Electronic System Design, pp. 188-193.

* cited by examiner

*Primary Examiner* — Harry W Byrne
(74) *Attorney, Agent, or Firm* — Patterson + Sheridan, LLP

(57) ABSTRACT

An integrated circuit device having a plurality of stacked dies is described. The integrated circuit device comprises a first die of the plurality of stacked dies having an input/output element configured to receive an input signal, the first die comprising a signal driver circuit configured to provide the input signal to each die of the plurality of stacked dies and a chip select circuit for generating a plurality of chip select signals for the plurality of stacked dies; and a second die of the plurality of stacked dies coupled to the first die, the second die having a function block configured to the receive the input signal; wherein the second die receives the input signal in response to a chip select signal of the plurality of chip select signals that corresponds to the second die. A method of implementing an integrated circuit device having a plurality of stacked dies is also described.

20 Claims, 7 Drawing Sheets

US 10,797,037 B1

INTEGRATED CIRCUIT DEVICE HAVING A PLURALITY OF STACKED DIES

TECHNICAL FIELD

The present invention relates generally to integrated circuit devices, and in particular, to an integrated circuit device having a plurality of stacked dies and a method of implementing an integrated circuit device having a plurality of stacked dies.

BACKGROUND

The implementation of integrated circuit devices continues to change with efforts to reduce the size, reduce the power, and increase the performance of integrated circuit devices. Different types of integrated circuit devices may include multiple dies, also commonly referred to as chips. Integrated circuit devices having multiple dies are often referred to as 3D integrated circuit devices. Some 3D integrated circuit devices having multiple dies may include an interposer, and are often referred to as devices implementing a Stacked Silicon Interconnect Technology (SSIT). For example, multiple dies may be individually placed on a surface of the interposer rather than stacked on one another. Microbumps and through-silicon vias (TSVs) may be used to connect each of the dies to the interposer. However, the size of the microbumps may cause the connections between the die to be limited. More recent generations of 3D IC devices may not include a silicon interposer, where the connections between the dies are provided by direct connections that may be implemented using hybrid bumps and through silicon vias. The size of a hybrid bump is generally smaller than microbumps, enabling more connections between the dies.

While the stacking of dies in a stacked integrated circuit device increases logic capacity of the integrated circuit device, it also decreases die edge width and the die surface area that has contact pads of the dies that can be accessed by a contact of the integrated circuit device itself. As the result of this reduction of die surface area, fewer pads on the top of a die that are accessible from a contact on the stacked integrated circuit device are available for testing and other access to dies of the integrated circuit device. Because of the reduced number of available pads on the top die, the number of power supply pads and ground pads on the top die may have to be reduced compared to a conventional monolithic integrated circuit device or an integrated circuit device having multiple dies individually placed on a surface of an interposer. The availability of input/output (IO) contacts, often referred to as IO pads, on the top die may also affect some necessary functions of the stacked IC devices, such as a testing function.

Accordingly, there is a need for a circuit for and method of implementing an integrated circuit device having stacked dies that overcomes problems associated with stacked dies, such as problems associated with the reduced number of IO contacts on a top die of the stacked dies.

SUMMARY

An integrated circuit device having a plurality of stacked dies is described. The integrated circuit device comprises a first die of the plurality of stacked dies having an input/output element configured to receive an input signal, the first die comprising a signal driver circuit configured to provide the input signal to each die of the plurality of stacked dies and a chip select circuit for generating a plurality of chip select signals for the plurality of stacked dies; and a second die of the plurality of stacked dies coupled to the first die, the second die having a function block configured to the receive the input signal; wherein the second die receives the input signal in response to a chip select signal of the plurality of chip select signals that corresponds to the second die.

A method of implementing an integrated circuit device having a plurality of stacked dies is also described. The method comprises configuring a first die of a plurality of stacked dies to receive an input signal at an input/output element; configuring a signal driver circuit of the first die to provide the input signal to each die of the plurality of stacked dies; configuring a chip select circuit for generating a plurality of chip select signals for the plurality of stacked dies; coupling a second die of the plurality of stacked dies to the first die, the second die having a function block configured to the receive the input signal; and receiving the input signal at the second die in response to a chip select signal of the plurality of chip select signals that corresponds to the second die.

DETAILED DESCRIPTION

The circuits and methods for implementing an integrated circuit device having stacked dies include a control circuit between an IO contact of a die and function blocks on one or more other die of the stacked dies. A control circuit on one die of a plurality of stacked dies enables access to the other dies of the plurality of stacked dies for any purpose, including programming purposes, testing purposes, or operational purposes. For example, a chip select circuit on the first die may be used to enable signals from a signal driver circuit to be routed to a circuit, such as a function block, of one of the other dies of the plurality of stacked dies. That is, by using a chip select circuit, a common signal driver circuit can be used to transmit signals to each of the other dies depending upon which of the other dies is selected by the chip select circuit. According to some implementations, the circuits and methods can be used with programmable logic devices (PLDs), where data can be routed to configuration memory arrays, often referred to a configuration random access memory (CRAM), related to a function block. The circuits and methods can also be used to improve the testability in 3D stacked dies technology. By using the control circuit on a die for accessing circuit elements of other dies in a stacked die arrangement, a small number of IO pads on the top of the die can be allocated to testing circuits, such as a CRAM or a function block, in each of the stacked dies.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
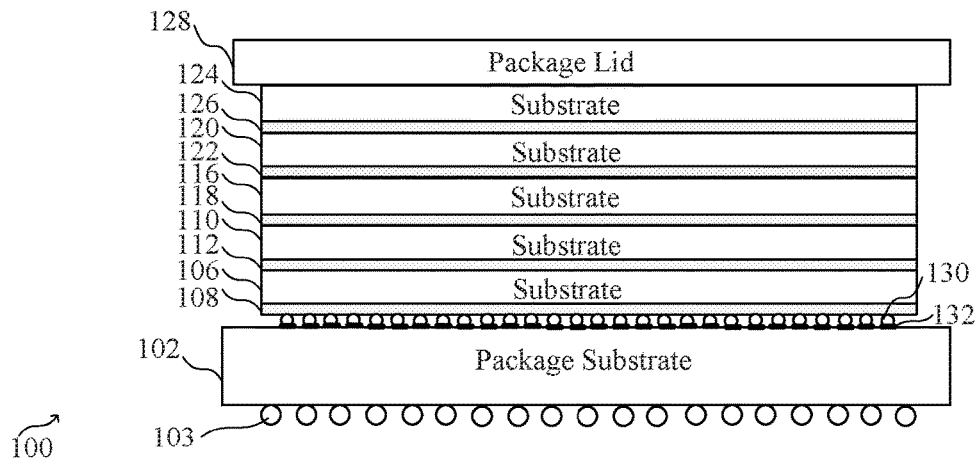
FIG. 1 is a block diagram of an exemplary stacked integrated circuit device.

Turning first to FIG. 1, a block diagram of an exemplary stacked integrated circuit device 100 is shown. More particularly, a substrate 102, shown here by way of example as a package substrate, is configured to receive a plurality of dies which are electrically connected by interconnect elements, as will be described in more detail in FIG. 2. The package substrate comprises solder balls 103, which may be used for attachment to a circuit board for example, and may be used to provide signals to or receive signals from the dies attached to the package substrate. Alternatively, the substrate could comprise an interposer that is positioned on a package substrate, or any other element used for receiving dies of an integrated circuit device. As shown in FIG. 1, a first stack of dies comprises a first substrate 106 having a corresponding interconnect layer 108 comprising interconnect elements that enable routing signals to the package substrate. The interconnect elements may comprise solder bumps, a hybrid interconnect technology, or any other conductive element for routing signals to and from the die, for example. A second substrate 110 has a corresponding interconnect layer 112 comprising interconnect elements that enable routing signals. A third substrate 116 has a corresponding interconnect layer 118 comprising interconnect elements that also enable routing signals. A fourth substrate 120 has a corresponding interconnect layer 122 comprising interconnect elements that also enable routing signals. A fifth substrate 124 has a corresponding interconnect layer 126 comprising interconnect elements that also enable routing signals. A package lid 128 may be included to cover the substrate 124 or encapsulate the plurality of dies. The substrate and interconnect layer pairs (106 and 108, 110 and 112, and 116 and 118, 120 and 122, 124 and 126) as shown form 5 die, and are configured to route signals between the die as will be described in more detail below in reference to FIG. 2. The interconnect layer 108 may be connected by solder bumps 130 (e.g. C4 bumps) to corresponding contact pads 132 of the package substrate to enable communication with the solder balls 103.

It should be understood that the arrangement of FIG. 1 is intended to show a general arrangement of stacked dies by way of example, where specific arrangements of the dies could have different configurations of Face-to-Face dies (also known as Active-on-Active (AoA) dies) and Face-to-Back dies, where face stands for a metal layer side back end-of-line (BEOL) and back stands for a substrate. The interconnect elements could include TSVs or BEOL metal layers of a die depending upon the configuration of the dies. For Face to Back bonding, the interconnections between the dies are implemented in substrate (e.g. using TSVs). According to one example, interconnect layer 112 may comprise metal layers (i.e. on a face) coupled to vias of a substrate 110 (i.e. back), where the interconnect layer 112 and the substrate 110 together make one die layer. The interconnections from one die to another die or between the substrate package and a die may include metal layers (e.g. hybrid bumps) or TSVs depending upon the orientation of the dies. While the exemplary stacked integrated circuit device 100 is shown by way of example, it should be understood other arrangements of dies could be implanted, including multiple stacks of dies.

Figure 2:
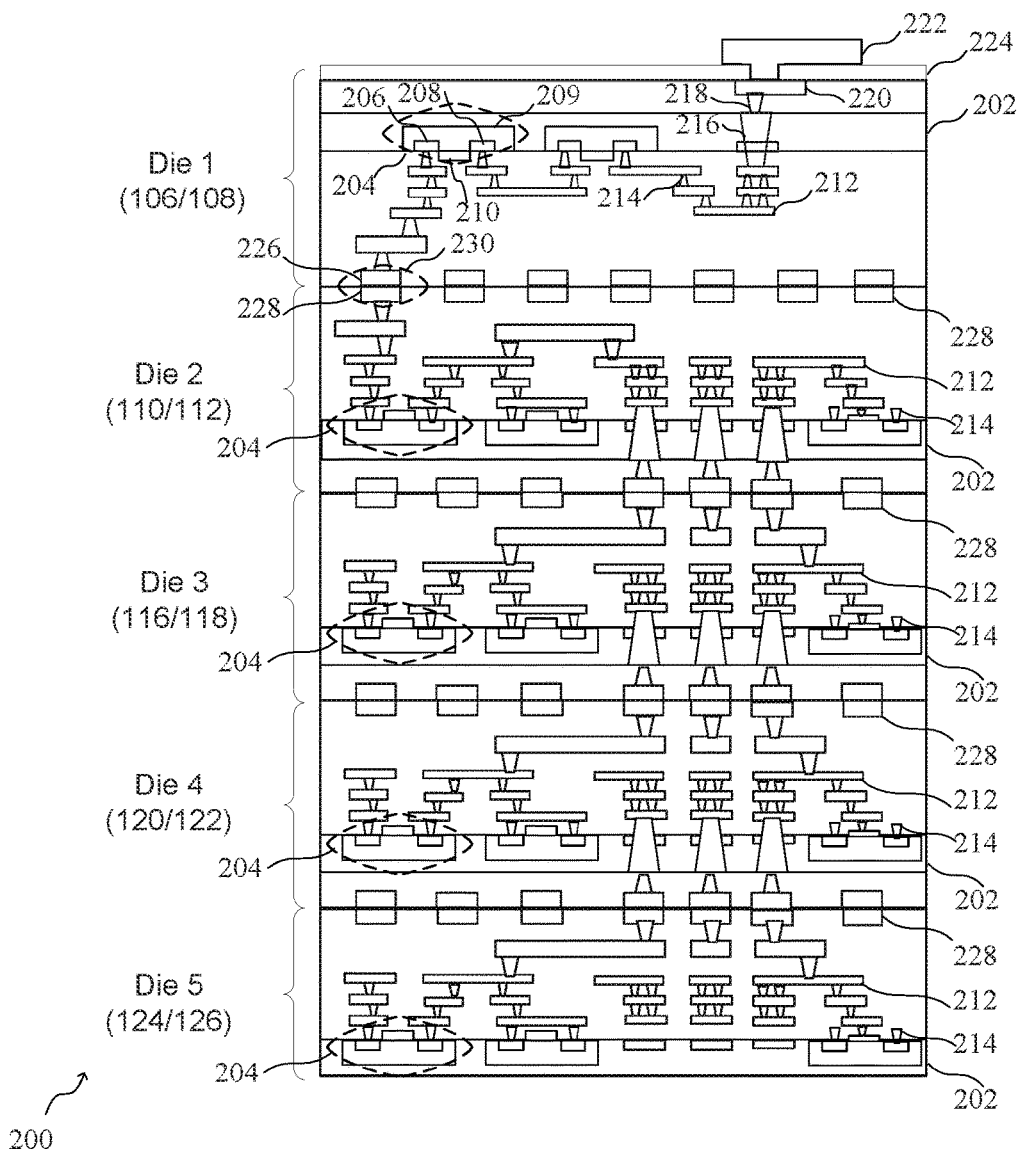
FIG. 2 is a cross-sectional view of an exemplary stacked integrated circuit device, such as the integrated circuit device of FIG. 1.

Turning now to FIG. 2, a cross-sectional view of a portion of an exemplary stacked integrated circuit device 200, which may be a cross-section of a portion of the integrated circuit device of FIG. 1, is shown. The stacked integrated circuit device 200 comprises a plurality of dies, shown here by way of example as Die 1-Die 5. Each of the die may generally comprise the same types of elements, such as active elements formed in silicon, metal traces and vias, which are designated in each of the die with the same reference numerals. For example, each die may comprise a substrate 202 having active elements 204, shown here by way of example as a transistor comprising a source 206 and a drain 208 in a well region 209, and a gate region 210.

The active elements of the substrate of a die are connected to one another and elements of other die by way of interconnect elements, which may comprise metal traces of metal layers separated by non-conductive layers and vias connecting portions of the metal layers through the non-conductive layers. More particularly, interconnect elements 212 in various layers may be coupled together by vias 214 as shown. Vias 216 extending through the substrate, often referred to as through silicon vias (TSVs), extend from contact elements 218 on the backside of the substrate, which may be coupled to a contact element 220 that enables a connect to a contact pad 222 extending through an insulation layer 224 to provide an external connection. Contact pad 222 could correspond to a contact pad of the interconnect layer 108 to enable a connection to a solder bump 130 on a contact pad 132, where interconnect elements of the substrate 102 enable connections to solder balls 103 for transmitting signals from the IC device or receiving signals at the IC device. Other contact elements may also be implemented for providing an electrical connection between dies. For example, a first contact element 226 of a first die may be electrically coupled to a second contact element 228 of a second die, where the contact elements 226 and 228 may be a part of a hybrid contact element 230. The example of FIG. 2 is provided to show an example of a device in which the circuits of FIGS. 3 and 4, as described in more detail below, can be implemented.

The circuit of FIG. 2 is shown by way of example, and can include any number of dies, which can be implemented in any orientation. While a face-to-face arrangement of the dies are shown between die 1 and die 2 and a face-to-backside arrangement are shown in the connections of the other die, it should be understood that other orientations of the dies may be implemented. Some or all of the die may be the same type of device, such as a programmable logic device (PLD), or may have a specific function, such as a memory or logic, in the different die.

Figure 3:
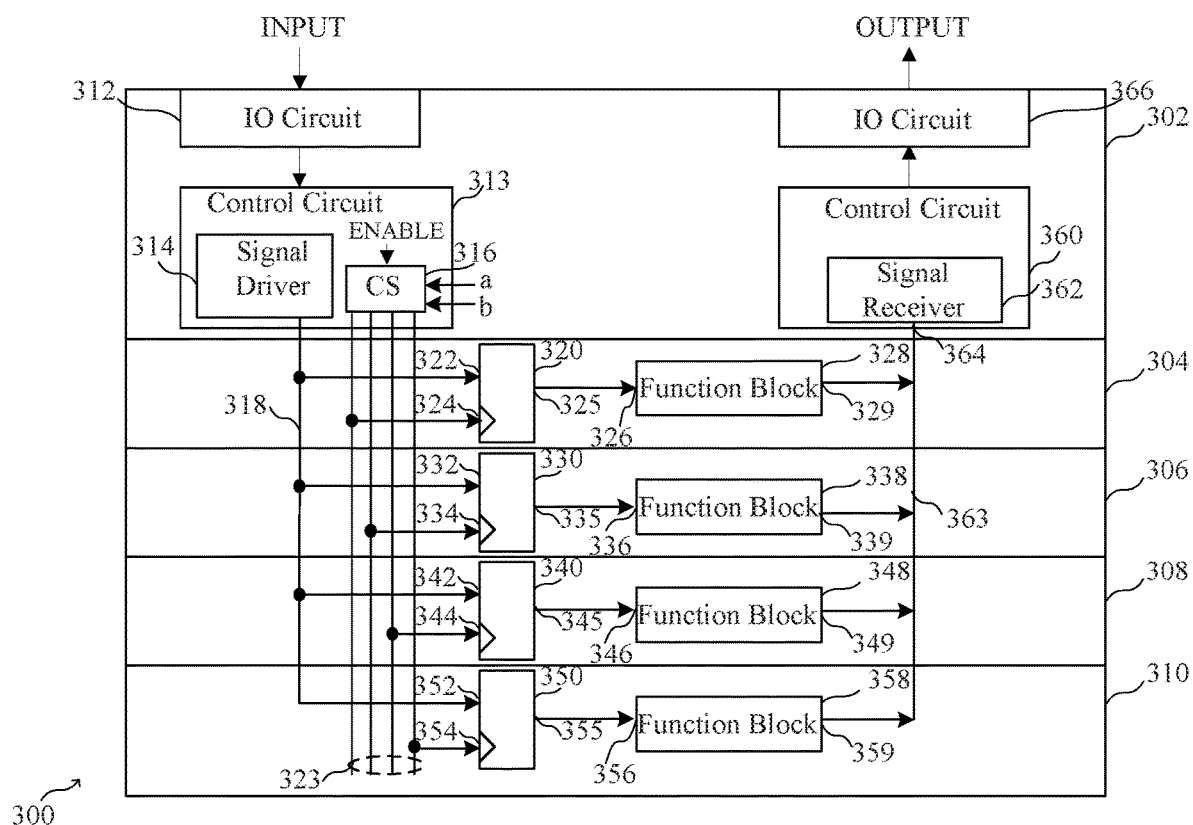
FIG. 3 is a block diagram of a portion of an integrated circuit device having stacked integrated circuit dies.

Turning now to FIG. 3, a block diagram of a portion 300 of an integrated circuit device having stacked integrated circuit dies is shown. The integrated circuit device could be implemented as shown in FIGS. 1 and 2, where an arrangement of elements in the different dies of the integrated circuit device are shown by way of example to enable the use of a circuit, such as driver circuit, that can be accessed by an IO contact on the integrated circuit device. By using a common circuit, such as the driver circuit on a first die of a plurality of stacked dies to drive signals to each of the other die of the plurality of stacked dies, the same IO contacts on the first die can be used to access a circuit, such as a function block, of each of the other die. That is, the same IO contact or contacts necessary to access a circuit on one die of the plurality of stacked dies could be used to access circuits of each of the other die of the plurality of stacked dies.

Referring specifically to the elements of the dies of FIG. 3, the portion of the integrated circuit device of FIG. 3 comprises, by way of example, 5 stacked dies, including a first die 302 (also known as a top die and which may correspond to Die 1 of FIG. 2 for example), a second die 304, a third die 306, a fourth die 308, and a fifth die 310. An IO circuit 312 of the top die may comprise a contact element that is accessible external to the integrated circuit. The IO circuit 312 is coupled to a control circuit 313, where the IO circuit 312 is shown by way of example here as providing a signal, which may be a received input (INPUT) signal at a contact element of the IO circuit 312, to the control circuit 313. For example, the IO circuit 312 may be coupled to a contact element 222 of FIG. 2 for example. It should be understood that the IO circuits may be implemented as dedicated input circuits, dedicated output circuits, or may function to both receive an input signal or generate an output signal, depending upon the operation of the control circuit or the functionality of the function block or other circuit receiving signals from the signal driver circuit. Examples of function blocks are described in more detail in reference to FIGS. 8 and 9 below.

The control circuit 313 may comprise a signal driver circuit 314 and a chip select circuit 316. That is, the control circuit enables the transfer of a signal to a circuit of another one of the plurality of dies by using chip select signals generated by a chip select circuit 316, where a chip select signal may operate as an enable signal to enable a circuit on a selected chip to receive the signal from the signal driver circuit 314. More particularly, the signal driver circuit 314 provides a signal by way of a signal line 318 to each of the dies 304-310. Although a single signal line 318 is shown, it should be understood that the single line 318 could be a multi-line signal line such as a signal bus for transmitting different signals (e.g. address, data and control signals), or that the multiple signal lines could be driven by the signal driver circuit. The signal line 318 is provided to a register 320 at a signal input 322.

The chip select circuit 316 generates chip select signals on chip select signal lines 323, where a signal from a first signal line of the chip select signal lines 323 is routed to an enable input 324 of the register 320. According to the implementation of FIG. 3, the select signal lines 323 comprise 4 lines, where each of the 4 dies 304-310 is coupled to a corresponding one of the chip select signal lines. According to other implementations, a signal on a single line provided to each of the dies may be decoded to determine whether data is intended for that die. The chip select circuit 316 may receive an enable (ENABLE) signal that is passed to certain die in response to enable select signals (a and b) as will be described in more detail in reference to FIG. 4. The chip select signal could be any type of signal enabling the register 320, such as a clock signal for example. The signal driven by the signal driver circuit 314 could be data stored in a memory, configuration data in a configuration memory for circuits of a PLD, control signals, or test signals for testing various circuits of the integrated circuit device, as will be described in more detail below. An output 325 of the register 320 is provided to an input 326 of a function block 328, where an output of the function block is generated at an output 329.

The signal generated by the signal driver circuit 314 is also provided by way of the signal line 318 to functions blocks of the other die 306-310. More particularly, the die 306 comprises a register 330 adapted to receive the data signal on the signal line 318 at a signal input 332, and an enable signal on a second signal line of the plurality of signal lines 323 at an enable input 334. Data generated at an output 335 of the register 330 is provided to an input 336 of a function block 338, where an output of the function block is generated at an output 339. Similarly, the die 308 comprises a register 340 adapted to receive the data signal on the signal line 318 at a signal input 342, and an enable signal on a third signal line of the plurality of signal lines 323 at an enable input 344. Data generated at an output 345 of the register 340 is provided to an input 346 of a function block 348, where an output of the function block is generated at an output 349. Further, the die 310 comprises a register 350 adapted to receive the data signal on the signal line 318 at a signal input 352, and an enable signal on a fourth signal line of the plurality of signal lines 323 at an enable input 354. Data generated at an output 355 of the register 350 is provided to an input 356 of a function block 358, where an output of the function block is generated at an output 359. Data generated by the function block can be routed to a control circuit 360 having a signal receiver 362 by way of a signal line 363 coupled to an input 364 of the signal receiver. The control signal may generate an output (OUTPUT) signal at an IO circuit 366.

As shown in FIG. 3, a signal provided on the signal line 318 is provided to multiple dies, such as by way of hybrid bonds or TSVs as described above in reference to FIG. 2 for example, where the signal on the signal line 318 may be received by a particular die or dies based upon the chip select signals generated by the chip select circuit 316. Therefore, it can be appreciated that only a single contact element, such as a bond pad of the IO circuit 312 is necessary to route signals to the function blocks 328, 338, 348, and 358 of the dies 304-310. That is, a common IO contact and a common signal driver circuit can be used to selectively route a signal to function blocks in different stacked die based upon a chip select signal generated in the first die.

Accordingly, the control circuit 313 on one die of a plurality of stacked dies can be used to enable access to the other dies of the plurality of stacked dies for any purpose, including programming purposes, testing purposes, or operational purposes. According to some implementations, the circuits and methods can be used with PLDs, as will be described in more detail below in reference to FIGS. 8 and 9, where data can be routed to configuration memory arrays, such as CRAM, related to a function block, as will be described in more detail below in reference to FIG. 5. The circuits and methods can also be used to improve the testability in 3D stacked die technology. By using the control circuit on a die for accessing circuit elements of other die in a stacked die arrangement, a small number of testing pads on top of the die is sufficient to test CRAM or functional blocks in each of the stacked dies. It should be noted that die 302 having the control circuits could also include function blocks, where signals could be routed to function blocks by the control circuits to enable testing or functional operation of the function blocks of die 302. Further, while input and output signals for configuring, testing and other operation are provided by way of the IO circuits (e.g. 312 and 366), it should be understood that the signals that are routed to or received from any of the dies 304-310 could be stored or generated in the die 302. While a single functional block is shown in each of the dies 304-310 and accessed by way of an IO circuit for providing data to the die 302 or an IO circuit for routing signals from the die 302, it should be understood that many functional blocks and IO circuits could be implemented in the dies as described above and interconnected as described in reference to FIGS. 8 and 9 below. The circuits may be implemented as a part of a wrapper circuit that provides test signals or other signals to a group of function blocks, which may be referred to as a wrapper.

Figure 4:
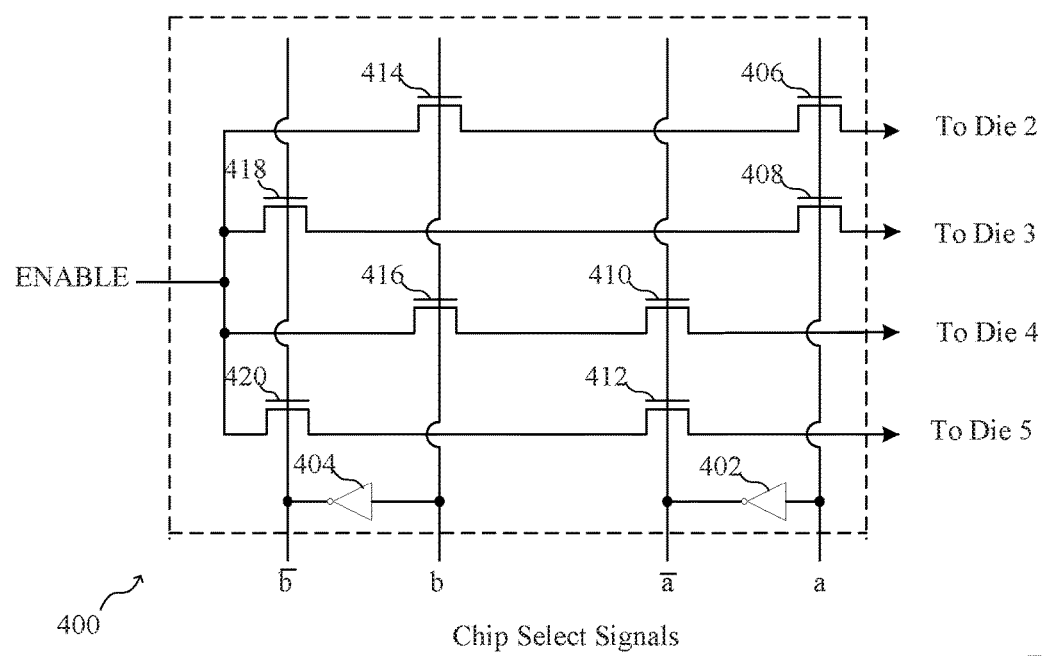
FIG. 4 is a block diagram of a chip select circuit that may be implemented in a die of a stacked integrated circuit device.

Turning now to FIG. 4, a block diagram of a chip select circuit 400 that may be implemented in a die of a stacked integrated circuit device is shown. As shown in FIG. 4, an enable (ENABLE) signal, such as an enable signal coupled to the chip select circuit 316 for example, may be generated using enable select signals a, a_bar, b, and b_bar, where the enable signal is provided to one of the die based upon the values of the enable select signals. More particularly, the enable select signal a is provided to an input of an inverter 402, where a_bar is generated at an output of the inverter 402. Similarly, the enable select signal b is provided to an input of the inverter 404, where the enable select signal b_bar is generated at the output of the inverter 404. The enable select signals a and b (and therefore the a_bar and b_bar) are selected to route the enable signal to the one of the die 2-die 5. That is, the enable select signal a is provided to the gate of a transistor 406 for routing the enable signal to die 2 and to a gate of transistor 408 for routing the enable signal to die 3. The enable select signal a_bar is provided to the gate of a transistor 410 for routing the enable signal to die 4 and to a gate of transistor 412 for routing the enable signal to die 5. The enable select signal b is provided to the gate of a transistor 414 for routing the enable signal to die 2 and to a gate of transistor 416 for routing the enable signal to die 4. The enable select signal b_bar is provided to the gate of a transistor 418 for routing the enable signal to die 3 and to a gate of transistor 420 for routing the enable signal to die 5. As shown in FIG. 4, the four combinations of a and b can select any one of the 4 dies to enable routing data signals to those dies. While the chip select circuit 400 is shown by way of example, it should be understood that other similar circuits could be implemented for providing an enable signal to one or more of the die.

Figure 5:
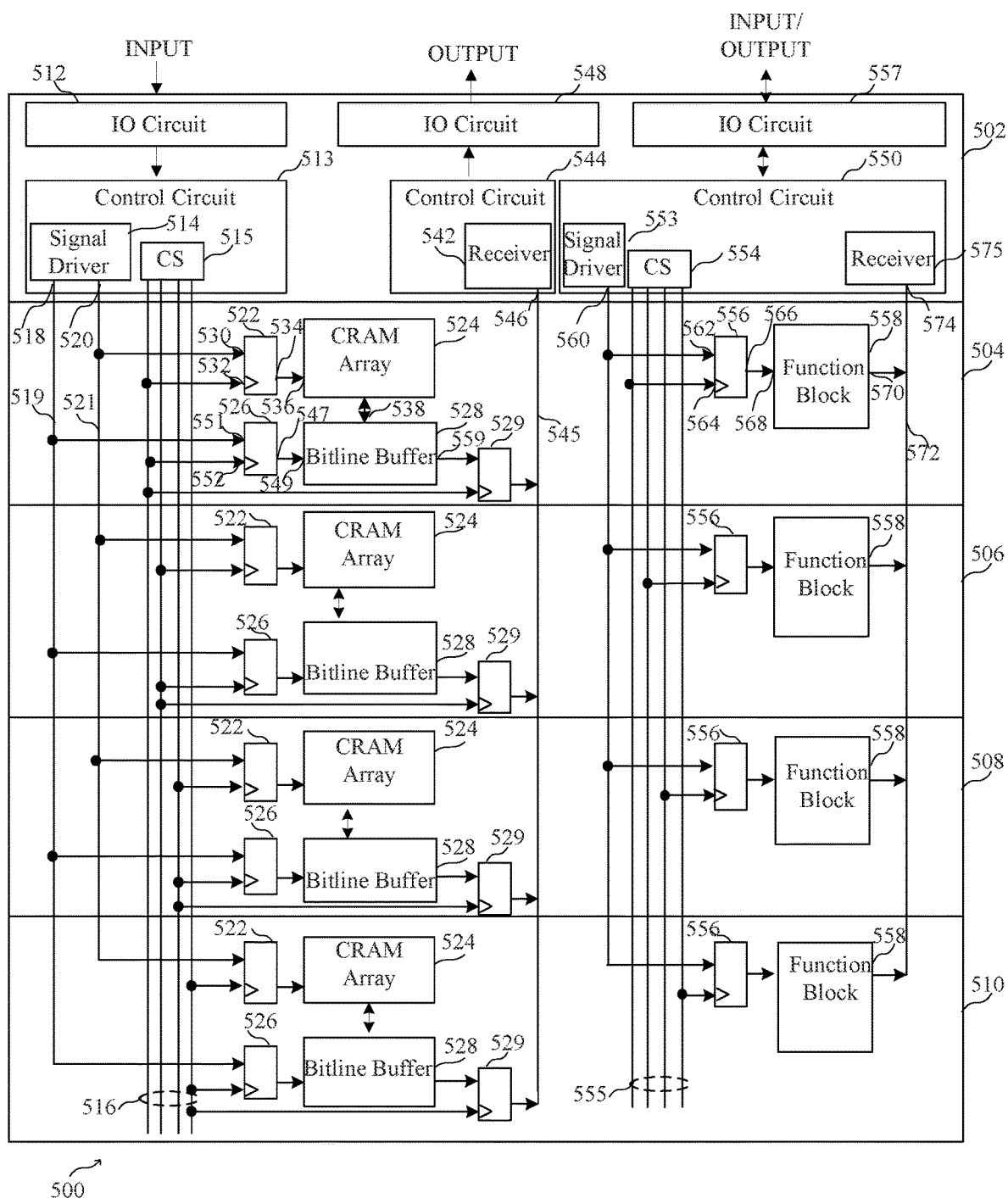
FIG. 5 is another block diagram of a portion of an integrated circuit device having stacked integrated circuit die.

Turning now to FIG. 5, another block diagram of a portion 500 of an integrated circuit device having stacked integrated circuit die is shown. According to the arrangement of FIG. 5, different IO circuits are used for different portions of the integrated circuit device. The integrated circuit arrangement of FIG. 5 comprises 5 die, including die 502-510 which can be implemented as described above in reference to FIGS. 1 and 2, where connections between the dies can be implemented using hybrid bonds or TSVs for example. An IO circuit 512 is configured to receive an input signal to the integrated circuit device at a contact element, such as a contact pad of the die 502, where the received input signal is provided to a control circuit 513. The control circuit 513 is adapted to the control a signal driver circuit 514 and a chip select circuit 515 to selectively provide signals to various circuit blocks in the different die. For example, the signal driven by the signal driver circuit could be data stored in a memory, addresses for storing or receiving data, configuration data for circuits of a PLD stored in a configuration memory, control signals, or test signals for testing various circuits of the integrated circuit device, as will be described in more detail below.

The signal driver circuit 514 is configured to drive signals to circuits of the die 504-510, while the chip select circuit 515 is configured to select a die that receives signals from the signal driver circuit 514 based upon signals from the chip select signal lines 516. According to the implementation of FIG. 5, a first output signal generated at a signal output 518 is provided on a first signal line 519 and a second output signal generated at a signal output 520 is provided on a signal line 521, where the signal lines 519 and 521 are routed to each of the dies 504-510. Each of the dies of the implementation of FIG. 5 comprises both a memory and a function block, where the memory may comprise configuration data for the function block, as will be described in more detail below.

Each of the dies include a register 522 adapted to receive data for a memory 524, shown here by way of example as a CRAM array, and another register 526 for receiving data for a bitline buffer 528 that is coupled to the memory 524 and a register 529, which may be a shift register for example that also receives the chip select signal associated with the die. More particularly, a signal from the signal line 521, which may be an address signal for example, is coupled to an input 530, while a chip select signal from a first chip select signal line of the plurality of chip select signal lines 516 is coupled to an enable input 532. It should be understood that the chip select signal could be any type of enable signal for enabling the register 522, and may comprise a clock signal for receiving data provided to the input 530. The register 522 may comprise a shift register for providing an address associated with data to be stored in the memory 524. Data generated at an output 534 of the register 522 is provided to an input 536 of the memory 524. The memory 524 communicates with the bitline buffer 528 by way of an interface 538, which enables reading data from the memory 524 to the bitline buffer or writing data from the bitline buffer to the memory 524. The die 502 also comprises a receiver circuit 542 of a control circuit 544. The receiver circuit 542 is configured to receive an output of register 529 of the bitline buffer of a selected die by way of a signal line 545 coupled to an input 546 of the receiver circuit 542.

The signal line 519 is coupled to an input 551 and the first chip select signal line of the plurality of chip select signal lines 516 is coupled to an enable input 552 of the register 526, where an output 547 is coupled to an input 549 of the bitline buffer 528. Data provided to the bitline buffer 528 may be written to the memory 524, or data read from the memory 524 and provided to the bitline buffer can be generated at an output 559 of the bitline buffer 528 and provided to the register 529. The die 502 also comprises an IO circuit 548 that enables generating an output based upon the signal provided by way of the register 529 to the receiver circuit 542, such as during testing. That is, the control circuit can provide signals received by the receiver circuit 542 to the IO circuit 548. According to another implementation, the output of the bitline buffer 528 could be held in a tri-state value, which would eliminate the requirement for the register 529 at the output of the bitline buffer 528.

The circuit arrangement of FIG. 5 may also include function blocks, where a control circuit 550 is coupled to an IO circuit 557, and also comprises a driver 553 and a chip select circuit 554 coupled to a plurality of chip select lines 555. Each of the dies include a register 556 and a function block 558, where a signal generated at an output 560 of the driver 553 is coupled to an input 562 of the register 556. The register 556 is configured to receive a signal for the function block and a chip select signal from a first chip select line of the plurality of chip select lines 555 at an input 564. An output 566 of the register 556 is coupled to an input 568 of the function block 558. An output 570 of the function block may be provided by a signal line 572 to an input 574 of a receiver circuit 575 of the control circuit 550. An output of the function block could be held in a tri-state value so that only the output of the function block of the selected die is provided on the signal line 572. Alternatively, a register could be implemented at the output 570, such as the register 529 at the output of the bitline buffer 528.

After a function block is designed, it is normally necessary to design a circuit which can facilitate testing this function block, for example a scan chain circuit. The control circuits of FIGS. 3 and 5 are implemented to enhance the testability and reduce circuit requirements by implementing a single circuit to facilitate testing of circuits of each die of a plurality of stacked dies. The control circuits act as an interface between IO circuit and a circuit of a die, such as a function block, that is tested. For example, test patterns and control signals may be loaded to a control circuit such as control circuit 513 or 550 from an IO circuit. These patterns and signals are then used to test the function block on another die. After testing, the test results can be loaded back to another control circuit and provided to IO circuit to be output by the integrated circuit device. According to some implementations, the control circuit may store input data and control data for testing a function block. For example, to test a math processor, input_A=00001, input_B=00010, control=00=>input_A+input_B; if control=01=>input_A× input_B.

It should be noted that the inputs and outputs of the various blocks are shown for purposes of an application of routing a signal to a particular die selected by a chip select signal, that the various blocks, such as the function blocks may have other outputs, and that the outputs of the various blocks that are shown may be provided to other portions of the integrated circuit device. The various connections to the circuit elements of the dies are provided for purposes of illustrating an implementation that allows the routing of data from a first die (e.g. die 502) to another die (e.g. one of dies 504-510) for the purposes routing signals to circuits of each of the die, and particularly the die that is selected by a chip select signal. According to some implementations, data may be received at the first die from the selected die, such as during a test operation for example.

While the circuit arrangement of FIG. 5 shows the use of control circuits for routing signals to a memory and a function block, it should be understood that the circuits and methods of routing signals to die of a plurality of stacked die can be implemented using any type of circuit block, such as any type of circuit block described in FIGS. 8 and 9 below. Further, the use of similar circuit blocks (i.e. a CRAM array having an associated bitline buffer and a function block) in each of the die is shown by way of example. It should be understood that it is not necessary that any of the dies have the same circuits, and that different dies can include similar circuits or can include different circuits. For example, one of the dies could include primarily memory elements, while 2 of the other dies could include primarily function blocks associated with a PLD.

Figure 6:
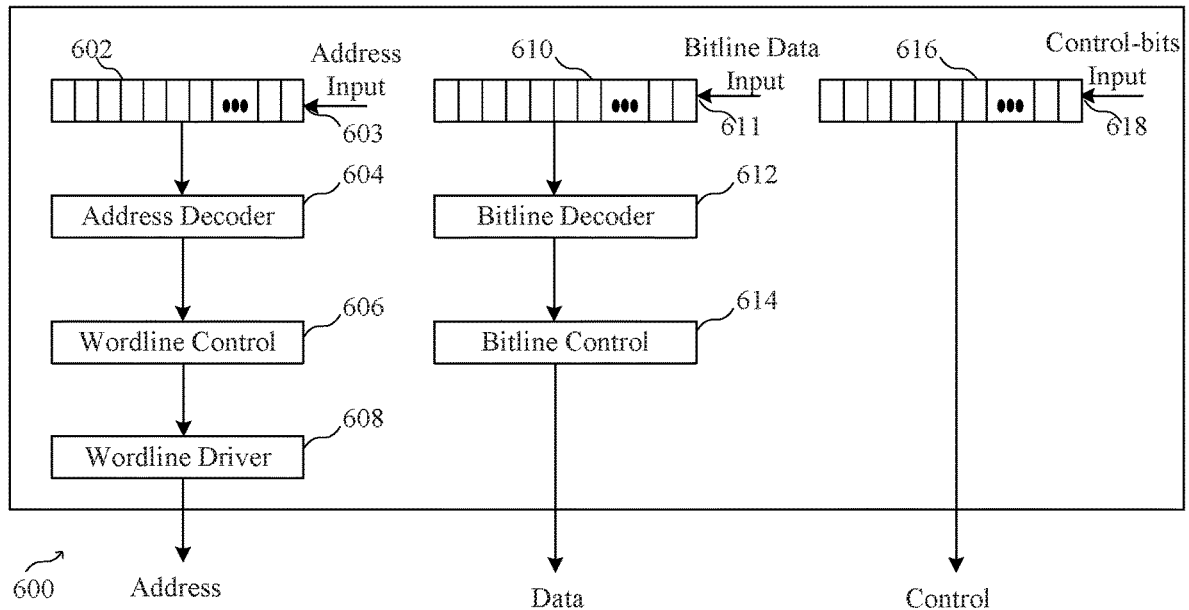
FIG. 6 is a block diagram of a signal driver circuit for transmitting signals between die of an integrated circuit device that may be implemented in a die of a stacked integrated circuit device.

Turning now to FIG. 6, a block diagram of a signal driver circuit 600 for transmitting signals between die of an integrated circuit device that may be implemented in a die of a stacked integrated circuit device is shown. The signal driver circuit 600 may be implemented as the signal driver circuit 314 of FIG. 3 or signal driver circuits 514 and 553 of FIG. 5. The signal driver circuit 600 comprises a first shift register 602 configured to receive an address at an address input 603. An output of the shift register 602 may be provided to an address decoder 604. A wordline control circuit 606 is configured to receive a decoded address, and provide an output to a wordline driver 608. An address generated by the wordline driver is generated as an output of the signal driver circuit 600. For example, the address could be provided to the input 530 of the register 522. This address can be used to select a frame address in a specific die. The signal driver circuit 600 may also comprise a shift register 610 configured to receive data at a bitline data input 611. An output of the shift register 610 is provided to a bitline decoder 612. An output representing a decoded value is provided to a bitline control circuit 614, which generates data that is output by the signal driver circuit 600. This data may be applied to datalines of CRAM cells on selected frame address. A control signal is also generated by a shift register 616 in response to input control bits provided to an input 618. These control bits are used to control operation of selected CRAM cells, such as read and write operations.

Figure 7:
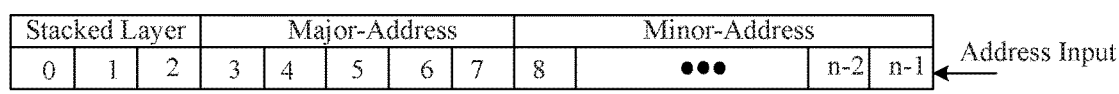
FIG. 7 is a diagram of an exemplary data that may be transmitted using shift registers of a signal driver circuit that may be implemented in a die of a stacked integrated circuit device.

As shown in FIG. 7, a diagram of an exemplary data that may be transmitted using shift registers of a signal driver circuit that may be implemented in a die of a stacked integrated circuit device is shown. According to one implementation, the address may comprise a plurality of fields, including a minor address, a major address, and a stacked layer. According to the example shift register of FIG. 7, the top row is the "label" and the bottom row is shift register where each small block ("0", "1", . . . ) stores one bit (bit0, bit1, bit2 . . . ). The shift register of FIG. 7 may dedicated to store a CRAM address for a CRAM array on each chip that is divided into many sectors. Each sector may contain a certain density of CRAM cells. A "Stacked Layer" (Bit0-bit2) may be used to store "chip address" (e.g. chip2, chip3, chip4, chip5), a "Major Address" (bit3-bit7) may be used to store the sector address, and the "Minor address" (bit8-bin (n−1)) may be used to store wordline address (WL0, WL1, WL2 . . . ). These address bits can be decoded to select one chip, one sector and one wordline associated with the memory array of the selected chip.

Figure 8:
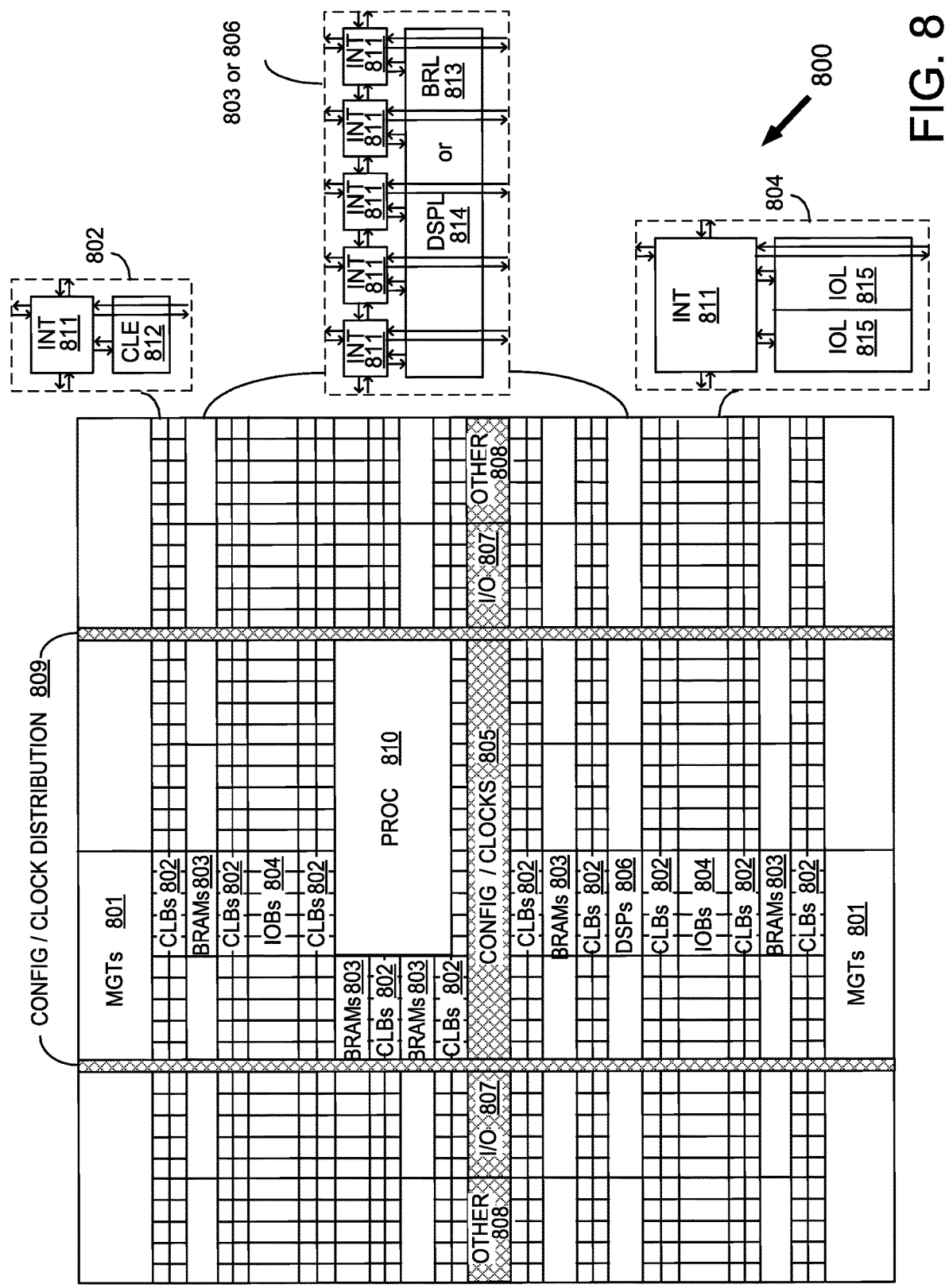
FIG. 8 is a block diagram of a programmable logic device that could implement the circuits and methods for transmitting signals in an integrated circuit device.

Turning now to FIG. 8, a block diagram of a programmable logic device that could implement the circuits and methods for transmitting signals in a stacked integrated circuit device is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA) having a variety of function blocks. In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources comprise function blocks that are customized by loading a configuration bitstream, typically from off-chip memory, into configuration memory cells of the FPGA. For both of these types of programmable logic devices, the functionality of the device is controlled by configuration data bits of a configuration bitstream (or configuration data bits sent during a partial reconfiguration) provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 8 comprises an FPGA architecture 800 having a large number of different function blocks that are implemented as programmable tiles including multi-gigabit transceivers (MGTs) 801, CLBs 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807 (e.g., configuration ports and clock ports), and other programmable logic 808 such as digital clock managers, analog-to-digital converters, system monitoring logic, and so forth. Some FPGAs also include dedicated processor blocks (PROC) 810, which may be used to implement a software application, for example.

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 may include a configurable logic element (CLE) 812 that may be programmed to implement user logic plus a single programmable interconnect element 811. A BRAM 803 may include a BRAM logic element (BRL) 813 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 806 may include a DSP logic element (DSPL) 814 in addition to an appropriate number of programmable interconnect elements. An IOB 804 may include, for example, two instances of an input/output logic element (IOL) 815 in addition to one instance of the programmable interconnect element 811. The circuits and methods could be implemented using the IOL 815. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear in order to facilitate the efficient implementation of user logic. While the implementation of FIG. 8 relates to an integrated circuit having programmable resources, it should be understood that the circuits and methods set forth above could be implemented in any type of device having a combination of programmable resources and hard blocks.

Figure 9:
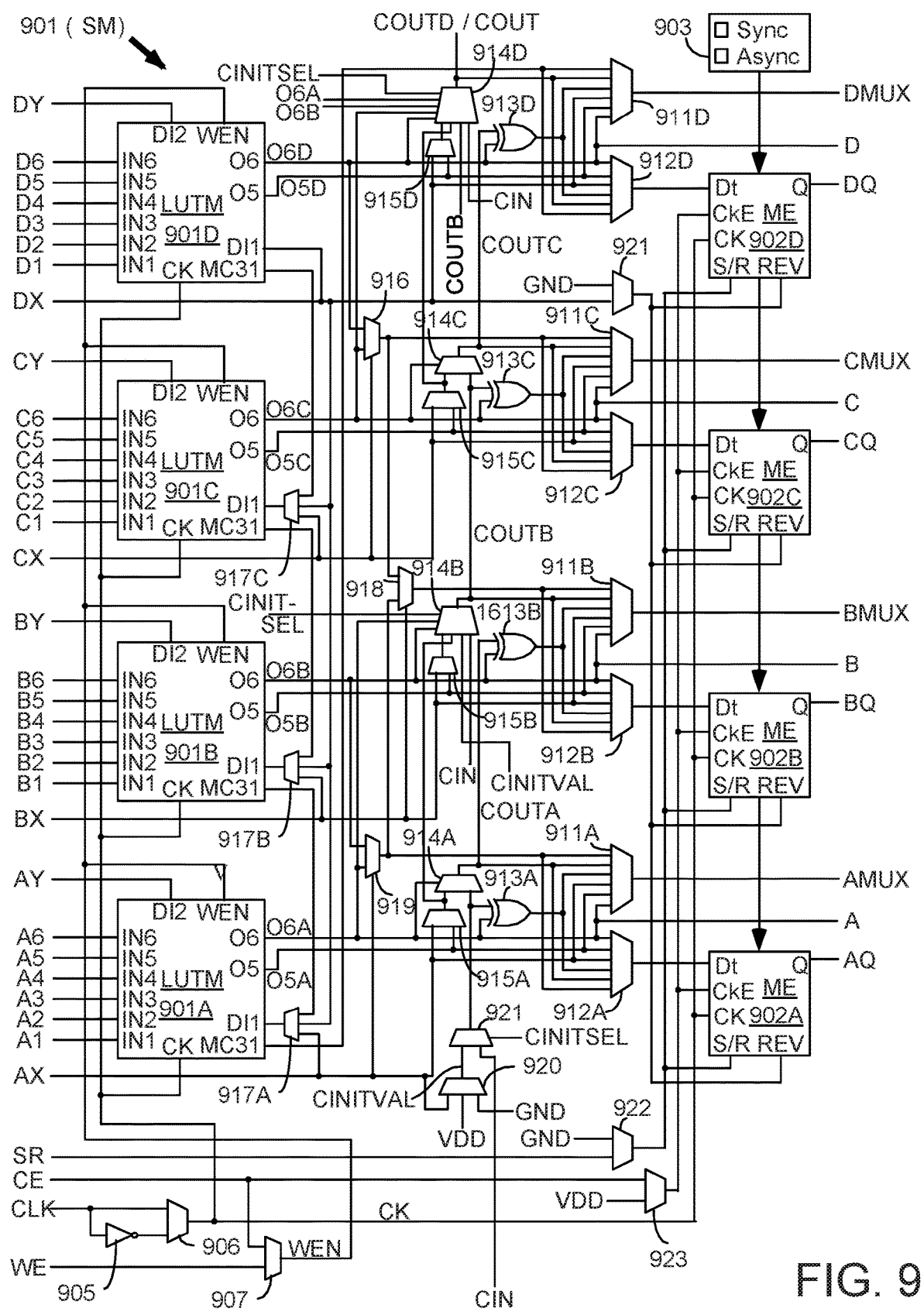
FIG. 9 a block diagram of a configurable logic element of the programmable logic device of FIG. 8.

Turning now to FIG. 9, a block diagram of a configurable logic element of the programmable logic device of FIG. 8 is shown. In particular, FIG. 9 illustrates in simplified form a configurable logic element, which is an example of Programmable Logic, of a configuration logic block 802 of FIG. 8. In the implementation of FIG. 9, slice M 901 includes four lookup tables (LUTMs) 901A-901D, each driven by six LUT data input terminals A1-A6, B1-B6, C1-C6, and D1-D6 and each providing two LUT output signals O5 and O6. The O6 output terminals from LUTs 901A-901D drive slice output terminals A-D, respectively. The LUT data input signals are supplied by the FPGA interconnect structure via input multiplexers, which may be implemented by programmable interconnect element 911, and the LUT output signals are also supplied to the interconnect structure. Slice M also includes: output select multiplexers 911A-911D driving output terminals AMUX-DMUX; multiplexers 912A-912D driving the data input terminals of memory elements 902A-902D; combinational multiplexers 916, 918, and 919; bounce multiplexer circuits 922-923; a circuit represented by inverter 905 and multiplexer 906 (which together provide an optional inversion on the input clock path); and carry logic having multiplexers 914A-914D, 915A-915D, 920-921 and exclusive OR gates 913A-913D. All of these elements are coupled together as shown in FIG. 9. Where select inputs are not shown for the multiplexers illustrated in FIG. 9, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 9 for clarity, as well as from other selected figures herein.

In the pictured implementation, each memory element 902A-902D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 902A-902D are clocked by a clock signal CK, which may be provided by a global clock network or by the interconnect structure, for example. Such programmable memory elements are well known in the art of FPGA design. Each memory element 902A-902D provides a registered output signal AQ-DQ to the interconnect structure. Because each LUT 901A-901D provides two output signals, O5 and O6, the LUT may be configured to function as two 5-input LUTs with five shared input signals (IN1-IN5), or as one 6-input LUT having input signals IN1-IN6.

In the implementation of FIG. 9, each LUTM 901A-901D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 917A-917C for LUTs 901A-901C), or to the two 32-bit RAMs via input terminals DI1 and DI2. RAM write operations in the LUT RAMs are controlled by clock signal CK from multiplexer 906 and by write enable signal WEN from multiplexer 907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 901A may also be provided to the general interconnect structure for shift register chaining, via output select multiplexer 911D and CLE output terminal DMUX. Accordingly, the circuits and methods set forth above may be implemented in a device such as the devices of FIGS. 8 and 9, or any other suitable device.

Figure 10:
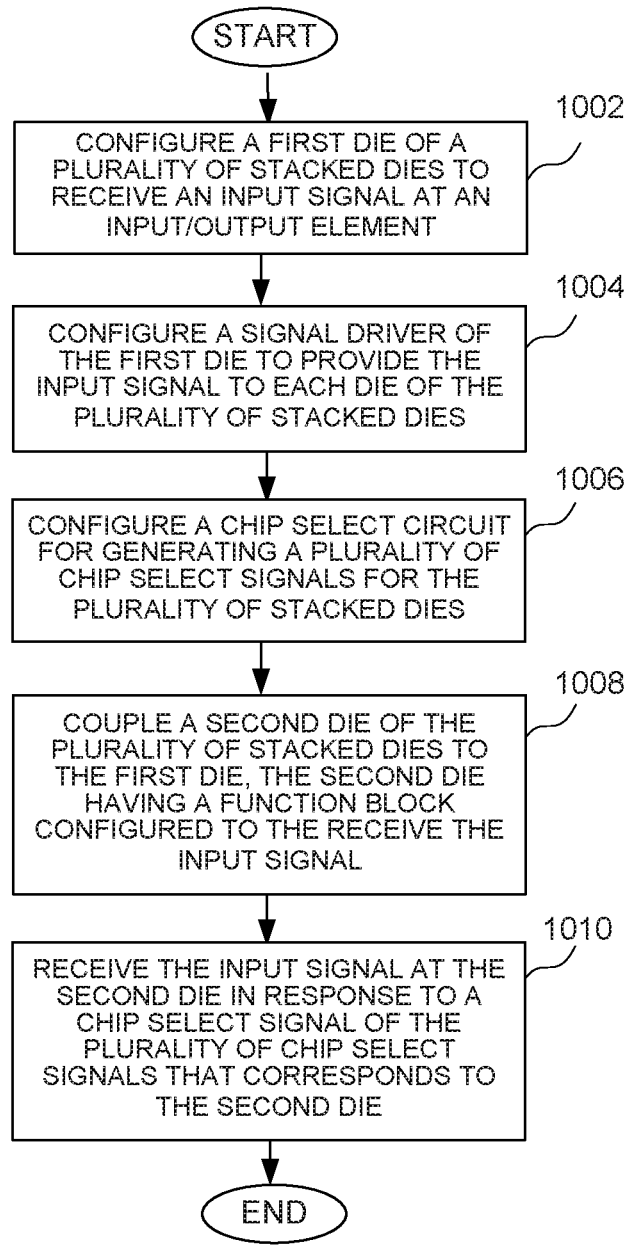
FIG. 10 is a flow chart showing a method of implementing a plurality of dies in a stacked integrated circuit device.

FIG. 10 is a flow chart showing a method of implementing a plurality of dies in a stacked integrated circuit device. A first die of the plurality of stacked dies, such as stacked dies of FIG. 3 or 5 for example, is configured to receive an input signal at an input/output element at a block 1002. An integrated circuit having a plurality of stacked dies and configured to receive an input signal could be formed as described above in reference to FIGS. 1 and 2 for example, or using other methods for forming an integrated circuit devices having stacked dies. A signal driver circuit of the first die, such as signal driver 314 or 514, is configured to provide the input signal to each die of the plurality of stacked dies at a block 1004. A chip select circuit is configured for generating a plurality of chip select signals for the plurality of stacked dies at a block 1006. A second die of the plurality of stacked dies is coupled to the first die at a block 1008, wherein the second die having a function block, such as function block 328, configured to the receive the input signal. The input signal is received at the second die in response to a chip select signal of the plurality of chip select signals that corresponds to the second die at a block 1010.

The method may also comprise configuring a receiver of the first die to receive an output signal of the function block, and coupling a second input/output element of the first die to receive the output signal. Further, the method may comprise configuring a register of the second die to receive the input signal from the signal driver circuit at a data input and to receive the chip select signal from the chip select circuit at an enable input. Data associated with the function block may also be stored in a memory of the second die. The method may further comprise configuring a first register the second die to receive the input signal from the signal driver circuit at a data input and to receive the chip select signal from the chip select circuit at an enable input, and coupling an output of the first register to an input of the memory. A second register may also be configured to receive an address signal from the signal driver circuit at a data input and the chip select signal from the chip select circuit at an enable input, and a bitline buffer of the second die may also be configured to receive the address signal at a data input and the chip select signal from the chip select circuit at an enable input. According to some implementations, additional dies may be stacked, such as by coupling a third die of the plurality of stacked dies to the second stacked die, wherein the third die comprises a register configured to receive the input signal from the signal driver circuit at a data input and the chip select signal from the chip select circuit at an enable input.

The method of FIG. 10 may be implemented using the circuits of FIGS. 1-9 as described, or using some other suitable circuits. While specific elements of the method are described, it should be understood that additional elements of the method, or additional details related to the elements, could be implemented according to the disclosure of FIGS. 1-9.

It can therefore be appreciated that new circuits for and methods of implementing a stacked integrated circuit device have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. An integrated circuit device having a plurality of stacked dies, the integrated circuit device comprising:
a first die of the plurality of stacked dies having an input/output element configured to receive an input signal, the first die comprising a signal driver circuit configured to provide the input signal to each die of the plurality of stacked dies and a chip select circuit for generating a plurality of chip select signals for the plurality of stacked dies; and
a second die of the plurality of stacked dies coupled to the first die, the second die having a function block configured to receive the input signal;
wherein the second die receives the input signal in response to a chip select signal of the plurality of chip select signals that corresponds to the second die.

2. The integrated circuit device of claim 1, wherein the first die comprises a receiver configured to receive an output signal of the function block.

3. The integrated circuit device of claim 2, wherein the first die comprises a second input/output element coupled to receive the output signal.

4. The integrated circuit device of claim 1, wherein the second die comprises a register configured to receive the input signal from the signal driver circuit at a data input and the chip select signal from the chip select circuit at an enable input.

5. The integrated circuit device of claim 1, wherein the function block comprises a memory element.

6. The integrated circuit device of claim 1, wherein the second die further comprises a memory configured to store data associated with the function block.

7. The integrated circuit device of claim 6, wherein the second die further comprises a first register configured to receive the input signal from the signal driver circuit at a data input and the chip select signal from the chip select circuit at an enable input, and an output of the first register is coupled to an input of the memory.

8. The integrated circuit device of claim 7, wherein the second die further comprises a second register configured to receive a data signal from the signal driver circuit at a data input and the chip select signal from the chip select circuit at an enable input.

9. The integrated circuit device of claim 8, wherein the second die further comprises a bitline buffer configured to receive the data signal at a data input by way of the second register.

10. The integrated circuit device of claim 1, further comprising a third die of the plurality of stacked dies coupled to the second stacked die, wherein the third die comprises a register configured to receive the input signal from the signal driver circuit at a data input and the chip select signal from the chip select circuit at an enable input.

11. A method of implementing an integrated circuit device having a plurality of stacked dies, the method comprising:
configuring a first die of a plurality of stacked dies to receive an input signal at an input/output element;
configuring a signal driver circuit of the first die to provide the input signal to each die of the plurality of stacked dies;
configuring a chip select circuit for generating a plurality of chip select signals for the plurality of stacked dies;
coupling a second die of the plurality of stacked dies to the first die, the second die having a function block configured to receive the input signal; and
receiving the input signal at the second die in response to a chip select signal of the plurality of chip select signals that corresponds to the second die.

12. The method of claim 11, further comprising configuring a receiver of the first die to receive an output signal of the function block.

13. The method of claim 12, further comprising coupling a second input/output element of the first die to receive the output signal.

14. The method of claim 11, further comprising configuring a register of the second die to receive the input signal from the signal driver circuit at a data input and to receive the chip select signal from the chip select circuit at an enable input.

15. The method of claim 11, wherein the function block comprises a memory element.

16. The method of claim 11, further comprising storing data associated with the function block in a memory of the second die.

17. The method of claim 16, further comprising configuring a first register of the second die to receive the input signal from the signal driver circuit at a data input and to receive the chip select signal from the chip select circuit at an enable input, and coupling an output of the first register to an input of the memory.

18. The method of claim 17, further comprising configuring a second register of the second die to receive a data signal from the signal driver circuit at a data input and the chip select signal from the chip select circuit at an enable input.

19. The method of claim 18, further comprising configuring a bitline buffer of the second die to receive the data signal at a data input by way of the second register.

20. The method of claim 11, further comprising coupling a third die of the plurality of stacked dies to the second stacked die, wherein the third die comprises a register configured to receive the input signal from the signal driver circuit at a data input and the chip select signal from the chip select circuit at an enable input.

* * * * *